(12) United States Patent
Rowell et al.

(10) Patent No.: US 10,333,631 B2
(45) Date of Patent: Jun. 25, 2019

(54) TEST ARRANGEMENT AND TEST METHOD

(71) Applicant: Rohde & Schwarz GmbH & Co. KG, München (DE)

(72) Inventors: Corbett Rowell, München (DE); Iratxe Fernandez Anton, München (DE); Hendrik Bartko, Unterhaching (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 15/685,264

(22) Filed: Aug. 24, 2017

(65) Prior Publication Data

US 2019/0068296 A1 Feb. 28, 2019

(51) Int. Cl.
| | |
|---|---|
| *H04B 17/00* | (2015.01) |
| *H04B 17/10* | (2015.01) |
| *H04B 17/318* | (2015.01) |
| *H04W 24/06* | (2009.01) |
| *G01R 29/08* | (2006.01) |
| *G01R 29/10* | (2006.01) |
| *H04B 17/12* | (2015.01) |
| *H04B 17/15* | (2015.01) |
| *H04B 17/29* | (2015.01) |

(52) U.S. Cl.
CPC ....... *H04B 17/101* (2015.01); *G01R 29/0871* (2013.01); *H04B 17/0085* (2013.01); *H04B 17/318* (2015.01); *H04W 24/06* (2013.01); *G01R 29/0892* (2013.01); *G01R 29/105* (2013.01); *H04B 17/12* (2015.01); *H04B 17/15* (2015.01); *H04B 17/29* (2015.01)

(58) Field of Classification Search
CPC ...... H04B 17/0085; H04B 3/46; H04B 17/15; H04B 17/29; H04W 24/06
See application file for complete search history.

(56) References Cited

U.S. PATENT DOCUMENTS

| | | | | |
|---|---|---|---|---|
| 6,525,657 | B1 * | 2/2003 | Wojcik | G01R 29/0821 324/612 |
| 2014/0024315 | A1 * | 1/2014 | Olgaard | H04B 17/00 455/67.11 |
| 2014/0256373 | A1 * | 9/2014 | Hernandez | H04B 17/12 455/509 |
| 2014/0281595 | A1 * | 9/2014 | Baker | G06F 1/30 713/300 |

OTHER PUBLICATIONS

Extended European search report for European Patent Application No. 17207891.7, dated Jun. 28, 2018, 9 pages.

(Continued)

*Primary Examiner* — Tuan Pham
(74) *Attorney, Agent, or Firm* — Westman, Champlin & Koehler, P.A.

(57) ABSTRACT

The present invention provides to a test arrangement and a test method for testing a device under test. In particular, a test arrangement is provided com-prising a device for vectorial analysis of measurement signals and at least one further device for analyzing only the power of radio frequency signals related to the de-vice under test. By simultaneously operating the device for vectorial analysis and the device for analyzing the power, an efficient testing can be achieved.

22 Claims, 4 Drawing Sheets

(56) References Cited

OTHER PUBLICATIONS

Remley, Kate A. et al: "Measurement Challenges for 5G and Beyond: An Update from the National Institute of Standards and Technology", IEEE Microwave Magazine, IEEEService Center, Piscataway, NJ, US, vol. 18, No. 5, Jul. 1, 2017 (Jul. 1, 2017), pp. 41-56, XP011651971, ISSN: 1527-3342, DOI: 10.1109/MMM.2017. 2690882 [retrieved on Jun. 7, 2017] *figures 16, 10*.

Fan Wei et al: "Measurement uncertainty investigation in the multi-probe OTA setups", The 8th European Conference on Antennas and Propagation (EUCAP 2014), European Association on Antennas and Propagation, Apr. 6, 2014 (Apr. 6, 2014), pp. 1068-1072, XP032643388, DOI: 10.1109/EUCAP.2014.6901953 [retrieved on Sep. 17, 2014] *figures 1, 2, 4*.

M. Kottkamp et al: Rohde And Schwarz: "Antenna Array Testing—Conducted and Over the Air: The Way to 5G White Paper Table of Contents 1MA286_2e Rohde & Schwarz Antenna Array Testing—Conducted And Over the Air: The Way to 5G 2 1 Introduction: What is 5G?", Mar. 20, 2017 (Mar. 20, 2017), XP055429495, Retrieved from the Internet: URL: https://cdn.rohde-schwarz.com/pws/dl_downloads/dl_application/application_notes/1ma286/1MA286_2e_AntArrTest_5G.pdf [retrieved on Nov. 28, 2017] *figures 4-14*.

\* cited by examiner

TEST ARRANGEMENT AND TEST METHOD

FIELD OF THE INVENTION

The present invention relates to a test arrangement for testing a device under test. The present invention further relates to a respective test method.

TECHNICAL BACKGROUND

Although applicable in principle to any wireless test system, the present invention and its underlying problem will be hereinafter described in combination with testing of beamforming of wireless devices.

In modern wireless communication systems the communication between the single devices is optimized by beamforming or beamsteering. During development or production of devices for such communication systems it is therefore necessary to thoroughly test the beamsteering capabilities of the devices for compliance with communication standards and legal regulations. Especially with beamforming devices it is therefore needed to perform a plurality of different tests requiring different measurement equipment.

For example, usually some tests require a detailed analysis of signals emitted by the device under test, wherein the detailed phase and/or amplitude of the signal is analysed. Furthermore, some other tests only require an analysis of the absolute power emitted by the device under test, which is usually carried out by another test equipment. Thus, performing multiple tests by different test equipment requires an extensive test procedure.

SUMMARY OF THE INVENTION

Against this background, there is the need to provide a versatile test equipment for beamforming capable devices.

According to a first aspect, a test arrangement for testing a device under test is provided. The test arrangement comprises a signal analysing device for measuring modulated signals emitted by the device under test and/or emitting modulated test signals to the device under test. The test arrangement further comprises a plurality of power analysing devices for measuring radio frequency power emitted by the device under test and/or emitting a continuous wave signal to the device under test. In particular, the signal analysing device and the power analysing device each are operated in a number of test sequences without removing or reconnecting the device under test.

According to a second aspect, a test method for testing a device under test is provided. The test method comprising a step of measuring modulated signals emitted by the device under test or emitting modulated test signals to the device under test with a signal analysing device. The test method further comprises a step of measuring radio frequency power emitted by the device under test or emitting a continuous wave signal to the device under test with a plurality of power analysing devices. The step of measuring modulated signals or emitting modulated test signals and the step measuring radio frequency power or emitting a continuous wave signal each are operated in a number of test sequences without removing or reconnecting the device under test.

The present invention is based on the fact that the multiple tests for testing of a beamforming device require different test equipment. Accordingly, when performing the multiple tests subsequently, the beamforming device must be placed into plurality of different test arrangements. Thus, such as test sequence is very time-consuming.

In particular, some of the tests which are to be applied to a beamforming device require a full analysis of modulated signals. The modulated signals may be either emitted by the device under test and received by test equipment, or modulated signals may be generated and emitted to the device under test.

It is understood that a modulation of the signal may be applied either to the phase of the signal or to the amplitude of the signal. Furthermore, it is also possible to apply a modulation to both, the phase and the amplitude of the signal. Additionally, when considering the modulation of a signal, it is also possible to take into account the polarization of the emitted radio frequency signal.

The analysis of modulated signals requires a complex test equipment comprising an appropriate measurement antenna and a corresponding signal processing equipment. Thus, to reduce the costs, such test equipment is only used for tests which require an analysis of modulated signals.

Some other tests require only analysis of the absolute amount of power which is emitted by the device to be tested. In some other test scenarios, a radio frequency signal with a continuous wave having a constant power may be applied to a device to be tested. These tests can be carried out by a much simpler and consequently cheaper test equipment.

However, when performing a test on a beamforming device, the position of device to be tested must be known very precisely. Consequently, the expense and time for positioning the device under test in a test arrangement is a very important factor when testing a device. Thus, when applying a test sequence in multiple different test arrangements, the time of for positioning the device in a plurality individual test arrangements is very crucial.

To reduce the time for testing a beamforming device and therefore to reduce the overall costs for testing the beamforming device, the present invention provides a test arrangement in which multiple tests can be applied. As a consequence, it is not necessary to move the device to be tested from one test arrangement to another test arrangement. Moreover, multiple tests can be applied in one single test arrangement without moving the device to be tested from one test arrangement to another. In this way, the efficiency for testing at beamforming device can be significantly increased.

By combining different test devices in one common test arrangement, multiple tests can be performed in one and the same test arrangement. In particular, the test arrangement according to the present invention provides at least one test device which is capable to perform tests with respect to modulated test signals. As mentioned above, the modulation of the signal may relate to the phase of the signal, the amplitude of the signal and/or the polarization of the signal. Furthermore, any other modulation or combination of modulations may be also possible.

Additionally, the test arrangement may also comprise a plurality of one or more test devices which only consider the amount of power emitted from the device under test in the direction of the test device or emitted from the test device in the direction to the device under test. By using a test device which only relates to the amount of power, a simple hardware is required and consequently, the costs for the test arrangement can be reduced.

By applying multiple test devices in a common test arrangement, it is possible to perform at least some of the tests without removing or reconnecting the device under test. In particular, the test devices which consider the modulation of signals and the test devices which only relate to the amount of power each may be operated in a same test configuration. In this connection, the term "test configuration" may be understood as a configuration of the test arrangement in which the device under test is operated without the need of rearranging the device under test in the test arrangement or modifying the connections, in particular changing any wired connections, of the device under test. Accordingly, the device under test has to be put into the test arrangement only once and remains in this test arrangement without any modifications for number of test sequences. In particular, the number of a test sequence may be performed by means of both, the signal analysing device and that power analysing device.

It is understood that any number of test sequences, i.e. one or more than one test sequence, may be performed by operating each of the signal analysing device and the power analysing device. Accordingly, due to the combination of the signal analysing device and the power analysing device, it is possible to perform very flexible and comprehensive tests of the device under test without rearranging the device under test in the test arrangement or without modifying the connections of the device under test. In this way, the time for testing a device can be reduced.

Further embodiments of the present invention are subject of the further subclaims and of the following description, referring to the drawings.

In a possible embodiment, the signal analysing device and the power analysing device are operated simultaneously.

Accordingly, the signal analysing device may emit modulated test signals or receive modulated signals from the device under test and at the same time, the power analysing device may emit a continuous wave signal to the device under test or determine the amount of power emitted from the device under test. By simultaneously operating both, the signal analysing device and the power analysing device, a comprehensive test of the device under test can be performed. For example, the power analysing device may emit a continuous wave signal and at the same time, the signal analysing device may analyse the impact of the emitted signal on the device under test. However, it is understood that each other combination of emitting or measuring signals by the signal analysing device and the power analysing device may be possible, too. Moreover, it is also possible that one signal analysing device may emit modulated signal and another signal analysing device may measure a modulated signal emitted by the device under test. Accordingly, it is also possible that a power analysing device may emit a continuous wave signal and another power analysing device may measure power of a signal emitted by the device under test.

In a possible embodiment, the signal analysing device comprises a measurement antenna for measuring the modulated signals emitted by the device under test and/or emitting the modulated test signals to the device under test. The signal analysing device may further comprise a signal analyser, which is electrically coupled to the measurement antenna. The signal analyser analyses the modulated signals measured by the measurement antenna. Additionally or alternatively, the signal analysing device may further comprise a signal generator for generating modulated test signals to be emitted by the measurement antenna.

The measurement antenna may be any kind of antenna which is appropriate for measuring the radio-frequency signals emitted from the device under test in the direction of the measurement antenna, or for emitting radio-frequency signals in the direction of the device under test. The measurement antenna may be adapted to the frequency range of the signals which are to be measured or to be emitted from the measurement antenna in the direction of the device under test. In particular, the measurement antenna may have only a very beam width which is directed to the device under test. Depending on the frequencies used for communication with the device under test, different antennas may be used. For example in the GHz frequency range microstrip antennas or the like may be used as measurement antenna elements.

The measurement antenna may be electrically connected to the signal analyser. In this way, the measured signals can be forwarded to the signal analyser in order to perform an analysis of the measured signals. For instance, the signal analyser may analyse the phase and/or the amplitude of the measured signal. In this way, an evaluation of the device under test can be performed. Furthermore, the frequency or the frequencies of the measured signal may be also taken into account when analysing the measured signal in the signal analyser.

In addition or alternatively to the analysis of measured signals, it is also possible to generate test signals and to emit the generated test signals with the measurement antenna to the device under test. For this purpose, the signal generator may be electrically coupled to the measurement antenna. The signal generator may generate a modulated test signal and forward the modulated test signal to the measurement antenna.

It is understood, that the measurement of signals from the device under test by the measurement antenna and the emitting of test signals from the measurement antenna to the device under test can be performed by the same measurement antenna. Furthermore, it is also possible to use different measurement antennas for measuring the signals from the device under test and for emitting test signals to the device under test.

Even though only a single signal measurement device is a mention above, it is also possible to use a plurality of one or more measurement devices in the test arrangement according to a possible embodiment of the present invention.

In a possible embodiment, the measurement antenna is arranged at boresight of the device under test.

The boresight of the device under test usually is the direction of the main radiation of the device under test. For instance, this direction may relate to one of the main axis of the device under test. In particular, this direction may be the direction of the main lobe in a standard configuration of the device under test. However, according to the desired test configuration and the configuration of the device under test, any other position of the measurement antenna may be possible, too.

In particular, if more than one measurement antenna is used in the test arrangement, an appropriate consideration for the positions of the measurement antenna may be selected.

In a possible embodiment, the test arrangement comprises mechanical positioning structure. The mechanical positioning structure may carry the measurement antenna and/or the power analysing devices. Further, the mechanical positioning structure may controllably move the measurement antenna and/or the power analysing devices around the device under test.

By moving the measurement antenna or the power analysing a device, the configuration of the test arrangement can be dynamically adapted. For instance, the position of the measurement antenna or the power analysing device may be changed during a test, or a plurality of different positions for the measurement antenna or the power analysing device may be set successively during testing a device under test.

Furthermore, it may be also possible to move the measurement antenna or the power analysing device to appropriate positions depending on the respective device under test. For instance, a measurement controller may identify the current device under test. Based on the identified device under test, the measurement controller may send instructions to the mechanical positioning structure in order to move the measurement antenna and/or the power analysing device to appropriate measuring positions.

In a possible embodiment, the mechanical positioning structure moves the measurement antenna and/or the power analysing devices around the device under test on a predetermined plane. For example, the predetermined plane may be a circular circumference or a spherical circumference.

However, any other appropriate plane for moving the measurement antenna or the power analysing device may be possible, too. In particular, the appropriate plane or the extension of the plane for moving the measurement antenna or the power measurement device may be adapted depending on the respective device under test. For instance, a measurement controller may identify the current device under test and the plane for moving the measurement antenna order power measurement device may be selected accordingly. In this way, the properties for measuring the device under test may be set up individually depending on the respective device under test.

The mechanical antenna positioning structure may comprise a beam that is coupled to an electric motor on one end and carries the measurement antenna or the power measurement device on the other end. A rotation of the axis of the electric motor would result in the respective element moving on a circular circumference, i.e. a 2D movement, around the axis of the electric motor. The electric motor could e.g. be positioned under the device under test. It is understood, that more complex mechanical constructions may be used that allow positioning the electric motor off-center, i.e. not under the device under test. Such constructions may comprise e.g. gears, belts, guides and slides for the measurement antenna or the power measurement device.

If the measurement antenna or the power measurement device is to be moved in a spherical circumference, i.e. a 3D movement, a gimbal or cardan style structure may be used to carry the link antenna.

In a possible embodiment, the plurality of power analysing devices are arranged at predetermined positions. In this way, a very simple configuration can be achieved, without any need for moving the power analysing devices. Accordingly, by such a fixed configuration, the number of one or more power analysing devices is well known and can be taken into account when evaluating the power measured by the respective power analysing devices.

In a possible embodiment, the test arrangement comprises a communication controller. The communication controller is communicatively coupled to the signal analysing device. In this way, the communication controller can perform communication with the device under test.

In a possible embodiment, the communication controller is communicatively coupled to the signal analysing device for providing the signal analysing device system with signals to be emitted to the device under test.

The communication controller may e.g. comprise a signal analyser for processing the communication signal from and to the device under test. The communication controller may further comprise any additional elements, like e.g. digital-to-analogue converters, analogue-to-digital converters, filters, attenuators, amplifiers and the like, that are necessary for performing the communication with the device under test via the measurement antenna. The communication controller may therefore act as or comprise a communication signal generator.

In this way, the signal measurement device, in particular the measurement antenna can be used for communication between the device under test and the communication controller. Accordingly, it is possible to perform a data exchange between the device under test and the communication controller. Based on such a communication, the communication controller can send commands to the device under test. For instance, the communication controller can send commands for setting up the device under test or setting a desired operation mode in the device under test. This enables controlling the device under test during the operation of the test. Hence, the tests scenario can be executed automatically without the need of manual impact of a user.

Furthermore, it is also possible to transmit information from the device under test to the communication controller. In this way, the communication controller can determine a current state or any other information about the device under test. This information can be taken into account when carrying out the test procedure for a device under test. Hence, the test results can be set in correlation with the respective information of the device under test received by the communication controller.

It is understood, that the communication between the communication controller and the device under test is not limited to the communication channel via the measurement antenna. Moreover, it is also possible to perform a communication between the communication controller and the device under test via any other communication channel. For instance, the device under test may be communicatively coupled with the communication controller via a wired connection. It is also possible to use another communication link between the communication controller and that device under test. For instance, a wireless communication via an optical communication link may be established.

For example, the test arrangement may further comprise a measurement controller for controlling the measurement of the test arrangement. In this case, the communication controller can be communicatively coupled with the measurement controller in order to set up the device under test and/or to send/receive data to/from the device under test during the test procedure. Accordingly, this data can be taken into account when performing the tests of a device under test in the test arrangement.

The measurement controller may be a control device, e.g. a control computer that controls, manages or performs the respective test or measurement of the device under test. The measurement controller may e.g. comprise a step-wise description of the test to be performed and execute the single steps one after the other. Such a description may e.g. define at which positions the measurement antenna or the power measurement device should be placed consecutively and what measurement data should be acquired, or which signal should be emitted to the device under test. The description may also define properties of the signals that are expected to be measured by the measurement antenna system. This may allow the measurement controller to verify or qualify the measured signals.

The measurement controller may be coupled to the mechanical positioning structure and control the position of the measurement antenna or the power measurement device via control signals to the mechanical positioning structure. It is understood, that the mechanical positioning structure may e.g. comprise an electric motor that may rotate the measurement antenna around the device under test. The mechanical positioning structure may further comprise a mechanical structure that carries the measurement antenna and is coupled to the electric motor to transfer a rotation of the electric motor into a movement of the measurement antenna.

In a possible embodiment, the test arrangement may comprise a mechanical device positioning structure that may carry the device under test and controllably rotates and/or translates, i.e. in one, two or three axis, the device under test.

The mechanical device positioning structure may comprise a controllably rotating plate that may in addition be elevated. The mechanical device positioning structure may e.g. comprise electric motors that allow for an automatic positioning of the device under test.

With the mechanical device positioning structure it is possible to rotate and/or move the device under test relative to the measurement antenna system and the link antenna. The test arrangement therefore allows performing measurements on the device under test very flexibly.

In a possible embodiment, the test arrangement may comprise a measurement chamber that may accommodate the signal analysing device, the plurality of power analysing devices and the device under test.

The measurement chamber may comprise a shielding or protective housing that isolates the test arrangement from any outside interference or disturbance during the measurements. It is understood that the measurement chamber may e.g. also comprise a door or sealable opening for accessing the insides of the measurement chamber, e.g. to place the device under test in the measurement chamber.

In a possible embodiment, the measurement chamber may comprise an anechoic chamber.

An anechoic chamber is a measurement chamber that is designed to completely absorb reflections of electromagnetic waves. The interior surfaces of the anechoic chamber may be covered with radiation absorbent material, RAM. RAM is designed and shaped to absorb incident RF radiation as effectively as possible. Measurements in electromagnetic compatibility and antenna radiation patterns require that signals arising from the test setup, like e.g. reflections, are negligible to avoid the risk of causing measurement errors and ambiguities.

With the anechoic chamber the quality of the measurements performed with the test arrangement may therefore be increased.

Where appropriate, the above-mentioned configurations and developments can be combined in any manner. Further possible configurations, developments and implementations of the invention also include combinations, which are not explicitly mentioned, of features of the invention which have been described previously or are described in the following with reference to the embodiments. In particular, in this case, a person skilled in the art will also add individual aspects as improvements or supplements to the basic form of the present invention.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DETAILED DESCRIPTION OF THE DRAWINGS

Figure 1:
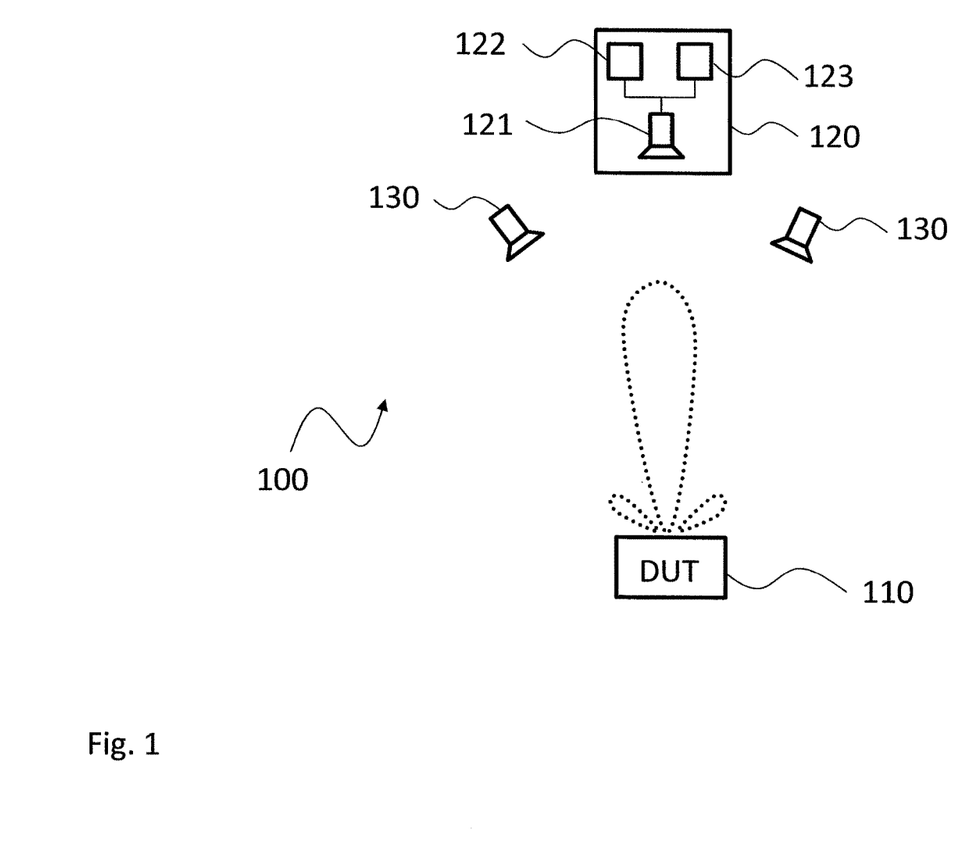
FIG. 1 shows a block diagram of an embodiment of a test arrangement according to the present invention.

FIG. 1 shows a block diagram of a test arrangement 100. The test arrangement 100 comprises a signal analysing device 120. The signal analysing device 120 comprises a measurement antenna 121. It is understood, that although only a single measurement antenna element 121 is exemplarily shown, the measurement antenna 121 may comprise any number, i.e. one or more, of measurement antennas 121 or measurement antenna elements.

The signal analysing device 120 may further comprises a signal analyser 122. Additionally or alternatively, that signal analysing device 120 may comprise a signal generator 123. It is also understood, that although a single signal analyser 122 and a single signal generator 123 is shown, the signal analysing device 120 may comprise any number of signal analyser 122 and any number of signal generator 123. In particular, each signal analyser 122 and each signal generator 123 may be electrically connected to a separate measurement antenna 121. However, it is also possible that signal analyser 122 and signal generator 123 may be connected to one common measurement antenna 121. Furthermore, it is also possible that more than one signal analyser 122 and/or more than one signal generator 123 may be connected to the measurement antenna 121. Even though only a single signal analysing device 120 is shown, the test arrangement 100 may comprise any number, i.e. one or more, signal analysing devices 120.

The test arrangement 100 further comprises a power analysing device 130. Although the present test arrangement 100 shows two power analysing devices 130, the test arrangement 100 may comprise any number, i.e. one or more, power analysing devices 130.

As illustrated, the signal analysing device 120 and the power analysing devices 130 may be arranged at a predetermined position in the test arrangement 100. For example, the measurement antenna 121 of the signal analysing device 120 may be arranged at a position to measure a boresight beam of the device under test at 110. It is understood, that the signal analysing device 120, in particular the measurement antenna 121 and the power measurement device is 130 may be also located at other positions than illustrated. In particular, the positions of the measurement antenna 121 and the power measurement devices 130 may be adapted according to the properties of the device under test 110.

The signal measurement antenna 121 of the signal analysing device 120 may measure radio frequency signals emitted by the device under test 110 and forward the measured signals to signal analyser 122. It is understood, that the characteristics of the measurement antenna 121 may be adapted to the desired measurement scenario. For instance, the bandwidth of measurement antenna 121, the width of the beam of measurement antenna 121 and/or the polarisation of the measurement antenna 121 may be adapted to the desired measurement scenario.

The measured signals which are measured by the measurement antenna 121 may be forwarded to a signal analyser 122. For this purpose, the measurement antenna 121 may be electrically connected to the signal analyser 122. For instance, an output terminal of the measurement antenna 121 may be connected to an input terminal of the signal analyser 122. In order to analyse the polarisation of the measured signal, a first measured signal, referring to first polarisation, for instance a horizontal polarisation, and second signal referring to second polarisation, for instance vertical polarisation, may be separately forwarded to the signal analyser 122.

The signal analyser 122 may analyse the measured signals provided by the measurement antenna 121. For example, signal analyser 122 may perform a vectorial analysis of the measured signals. For this purpose, signal analyser 122 may be a vector analyser or another appropriate device for analysing the measurement signals are provided by measurement antenna 121. In particular, signal analyser 122 may analyse the modulation of the measured signals provided by measurement antenna 121. It is understood, that any appropriate modulation of the signals may be analysed. For example, the modulation of the phase of measured signals, the modulation of the amplitude of the measured signals and/or the modulation of the polarisation of the measured signals may be analysed. In particular, it may be analysed whether or not the measured signals fulfils predetermined conditions in order to pass a predetermined test scenario.

By analysing the modulation of the measured signals, it may be a further possible to determine any kind of information which is encoded in the measured modulated signal. Accordingly, the information related to the modulation of the signal may be extracted and taken into account when performing a test of the device under test 110.

Further, signal generator 123 of the signal analysing device 120 may generate modulated radio frequency signals and provide the generated modulated radio frequency signal to measurement antenna 121. Accordingly, the generated signal can be emitted by measurement antenna 121 to the device under test 110. It is understood, that the modulation of the generated modulated radio frequency signals may refer to a modulation of the phase, the amplitude and/or the polarisation of the generated signals. In particular, by modulating the signals provided by signal generator 123, it is possible to encode information in the modulated signal. Accordingly, it is possible to provide the device under test 110 with encoded information by emitting modulated signals from the measurement antenna 121 to the device under test 110. In this way, it is a possibility to analyse the response of the device under test 110 based on the provided modulated signal.

Power analysing device 130 may determine an amount of radio frequency power emitted by the device under test 110 in the direction of power analysing device 130. For instance, power analysing device 130 may comprise a diode power sensor, a thermal power sensor or any other kind of power sensor. Power analysing device 130 only measures an absolute amount of power of the signal emitted by the device under test 110 in the direction of the power analysing device 130. Accordingly, power sensor 130 usually does not perform an analysis of any kind of modulation of measured signal. In this way, the hardware of power analysing device 130 usually is much simpler than the hardware of signal analysing device 120. Consequently, power analysing device 130 may be smaller and requires less space when building a test arrangement 100 for testing the device under test 110.

Additionally or alternatively, power analysing device 130 may generate and emit a radio frequency signal. For instance, the radio frequency signal by be a continuous wave signal. The generated signal may comprise one or more predetermined frequencies. Further, the generated signal may be emitted with a predetermined power, for instance, a predetermined amplitude. In this way, the impact of such a continuous wave signal to the device under test 110 can be analysed. It is understood, that the power measurement of the power analysing device 130 and the generation of continuous wave signals may be performed either by separate power analysing devices 130 or by one common power analysing device 130.

In the described test arrangement 100, a plurality of tests can be performed. In particular, it is possible to perform a sequence of multiple tests without changing the test arrangement or putting the device under test 110 into a plurality of different test arrangements.

For instance, it is possible to measure the overall emitted power over the device under test by means of a plurality of power measurement devices 130 which are arranged in the test arrangement 100. Furthermore, the beamforming properties of the device under test 110 may be analysed, or characteristic parameters of the beamforming may be determined. For example, a beam sweep time may be determined while electrically sweeping the beam of the device under test 110.

Furthermore, if more than one power measurement device 130 is arranged in the test arrangement 100, the individual power measurement devices 130 may be communicatively coupled with each other. In this way, the phases of the individual power measurement devices 130 can be synchronised. Accordingly, it is possible to lock the phases of the individual power measurement devices 130. The synchronised power measurement devices 130 may form a beamforming array. For example, the phases of the individual power measurement devices 130 may be weighted accordingly to achieve a desired beam configuration built by the arrangement of the coupled power measurement devices 130.

It is understood, that the position of the power measurement devices 130 may be selected according to the desired test scenario. In particular, it is also possible to arrange the power measurement devices 130 on or nearby the measurement antenna 121. In this way, the power measurement device 130 may generate a signal to test the receiving beam pattern of the measurement antenna 121. Furthermore, this also possible to generate one or more blocking signals by means of the power analysing device 130. In this way, a response of test configuration based on the generated blocking signals can be analysed.

The operation of the signal analysing device 120 and the power analysing device 130 may be performed depending on the desired test scenario. In particular, a test sequence may be performed by operating each of the signal analysing device 120 and the power analysing device 130. Especially, the signal analysing device 120 and the power analysing device 130 may be both operated during test sequence without removing the device under test 110 from the test arrangement 100 or without modifying the connections of the device under test 110. It is understood, that even more than one test sequence may be performed by the test arrangement 100 without removing the device under test from the test arrangement and/or performing re-connections of the device under test in the test arrangement 110.

In particular, it is possible to perform a simultaneous measurement of the signal analysing device 120 and the power analysing device 130. The results of the measurements by the signal analysing device 120 and the power measurement device 130 as well as the signals emitted by a signal analysing device 120 and the signals emitted by the power measurement device 130 may be considered individually or may be considered in combination.

Figure 2:
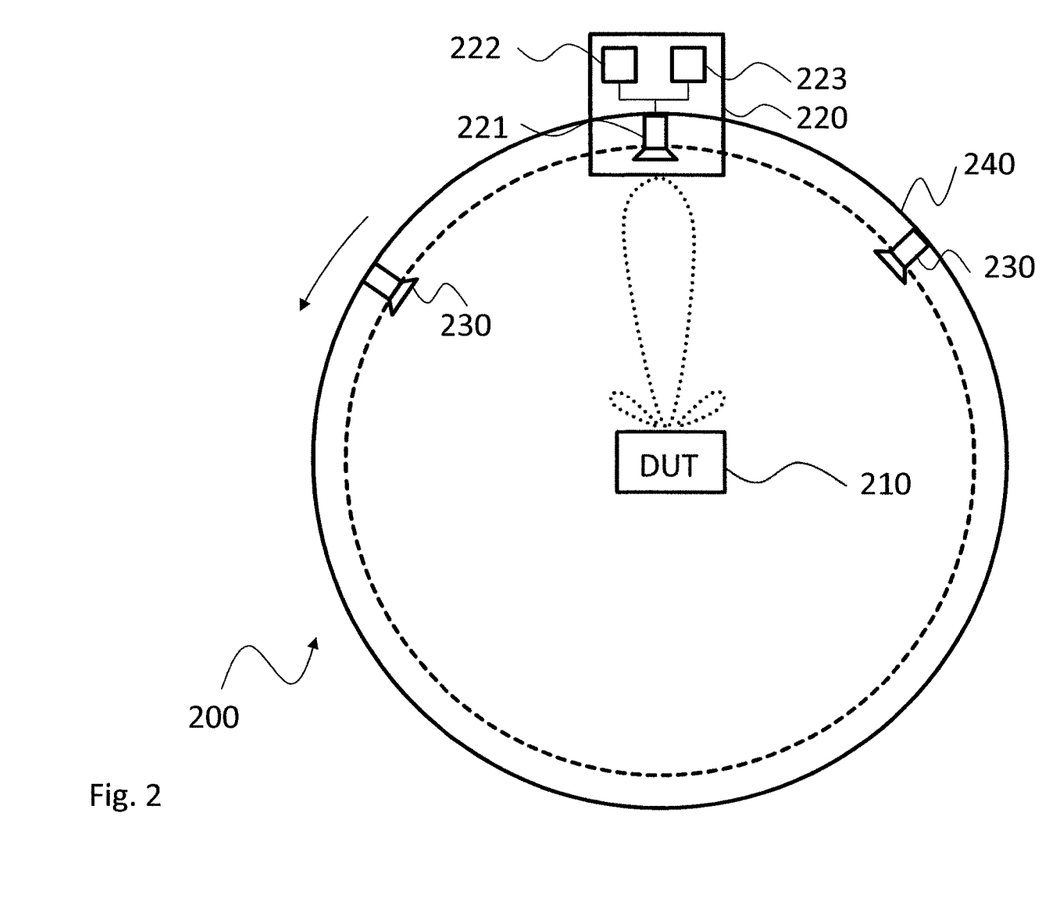
FIG. 2 shows a block diagram of another embodiment of a test arrangement according to the present invention.

FIG. 2 shows a block diagram of a test arrangement 200. The test arrangement 200 is based on the test arrangement 100. Therefore, the test arrangement 200 also comprises a signal measurement device 220 and measurement devices 230.

In the configuration of FIG. 2, the test arrangement 200 further comprises a mechanical positioning structure 240. The mechanical positioning structure 240 moves the measurement antenna 221 and/or the power measurement devices 230 around the device under test 210 on a circle or a circular circumference. It is understood, that the test arrangement 200 is shown in a top-down view and that the circular circumference is also shown in a top-down view. The circular circumference is therefore a two-dimensional circumference. It is further understood, that the mechanical antenna positioning structure 240 may also move the measurement antenna 221 and/or the power measurement device 230 on a spherical circumference, i.e. a three-dimensional circumference.

It is understood, is that even though only a circular or spherical circumference is described here, the present invention is not limited to such circumference. Moreover, any other appropriate circumference may be possible, too.

Figure 3:
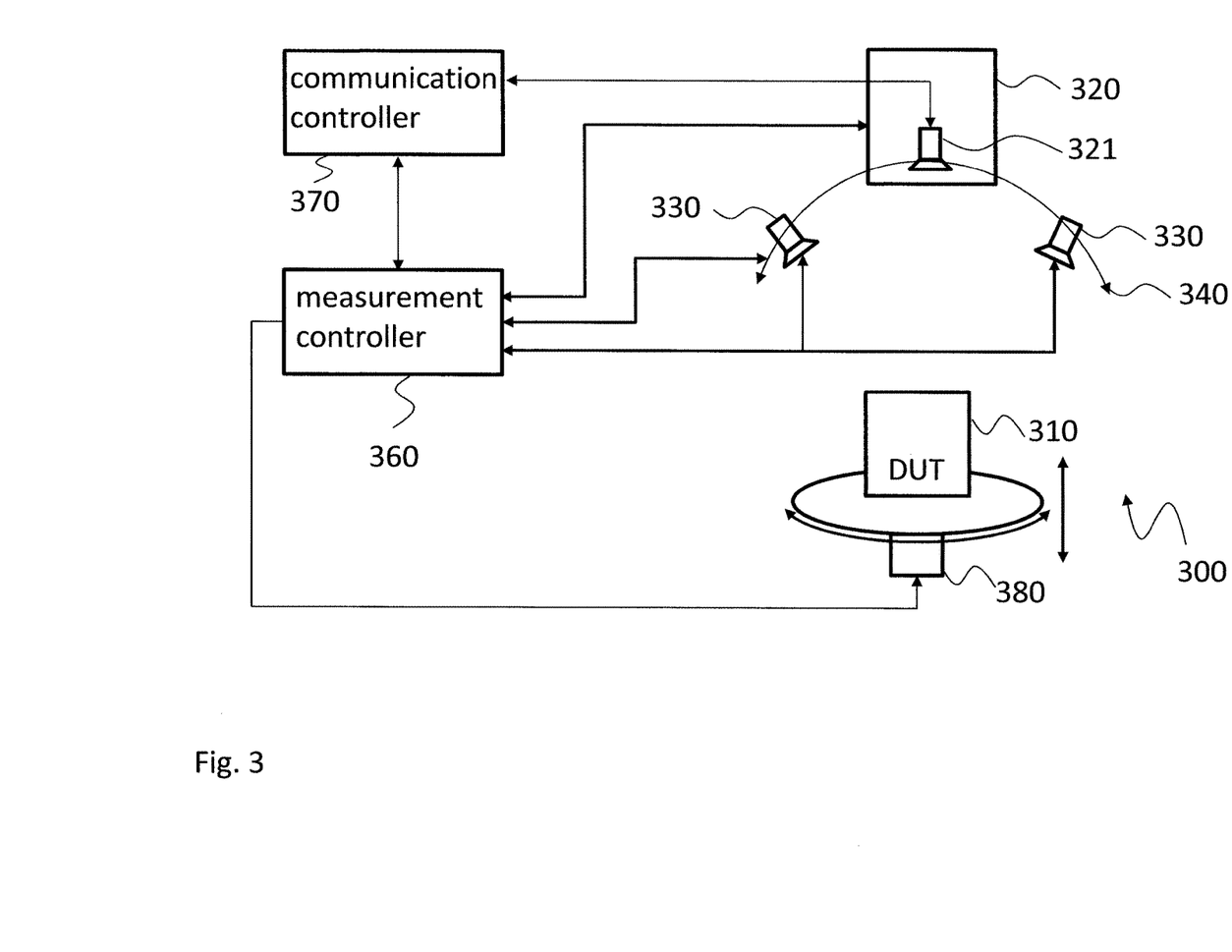
FIG. 3 shows a block diagram of another embodiment of a test arrangement according to the present invention.

FIG. 3 shows a block diagram of a test arrangement 300. The test arrangement 300 focuses on the control and measurement side and does therefore not explicitly show the mechanical arrangements as shown in FIG. 2. It is however understood, that the below explanations and the elements of the test arrangement 300 may be combined with any element of the test arrangement 100, 200.

The test arrangement 300 comprises a measurement controller 360 and a communication controller 370. The measurement controller 360 is coupled to the mechanical antenna positioning structure 340, the signal measurement device 320 and the power measurement device 330. The measurement controller 360 may control the position of the measurement antenna 321 via the mechanical antenna positioning structure 360 and may also receive the signals received by the signal measurement device 320 and/or the power measurement device 330, e.g. to evaluate the received signals.

The communication controller 370 is coupled to the measurement antenna 321 to perform the communication with the device under test 310. In this way, the communication controller 370 can send data, for example commands or instructions, to the device under test 310 via a wireless communication link. For example, the communication controller 370 may send data to the device under test 310 for initially setting up the device under test 310 or for changing the operation mode in the device under test 310 during a test scenario. Furthermore, any other data may also be send from the communication controller 370 the device under test 310.

The communication link between the communication controller 370 and the device under test 310 is not only limited to a unidirectional communication. Moreover, it is also possible to receive, by the communication controller 370, data from the device under test 310. In this way, according to the received data, the present state of the device under test 310 can be determined, or any other properties about the device under test 310 can be evaluated by the communication controller 370. Accordingly, the received data from the device under test 310 can be also taken into account when performing a test scenario for a device under test 310.

It is understood, that the communication between the communication controller 370 and the device under test is not only limited to the wireless communication via the measurement antenna 321. Furthermore, it may be also possible to use another link antenna (not shown) for the communication between the complication controller 370 and that device under test 310. Furthermore, it is also possible to use another communication link, for instance, a wired connection between the communication controller 370 and the device under test 310, or an optical link between the communication controller 370 and that device under test 310.

The test arrangement 300 may further comprises a mechanical device positioning structure 380. The mechanical device positioning structure 380 may rotatably move the device under test 310 and elevate the device under test 310. The movement of the device under test 310 may also be controlled by the measurement controller 360.

The test arrangement 300 further comprises an anechoic chamber. The anechoic chamber comprises absorbing elements. The absorbing elements absorb or deflect the wireless signal and therefore prevent reflections of wireless signals. The anechoic chamber may e.g. comprise an opening or a door that allows inserting and removing the device under test 310.

Accordingly, for an automated test of a device under test 310, the device under test 310 may be automatically positioned at a desired location in the test arrangement 300. Upon the device under test 310 is arranged at the desired position in the test arrangement 300, the device may be set up accordingly and the test sequence can be started. After the test sequence has been finished, the device under test 310 may be automatically removed from the test scenario and another device under test 310 may be placed in the test arrangement of 300. In this way an automated test of the devices under test can be achieved.

It is understood, that signal process 122, 222, signal generator 123, 223, the power analysing device 130, 230, 330, the measurement controller 360, the communication controller 370 or any other of the above mentioned controllers may be implemented as hardware, software or any combination of hardware and software. Such a device may e.g. comprise a processor that comprises D/A converters and A/D converters or is coupled to D/A converters and A/D converters for sending and receiving wireless signals. Further, such a processor may comprise digital I/O ports or pins or a digital bus interface that may serve to communicate with the mechanical positioning structure 240, 340 and/or the mechanical device positioning structure 380.

For sake of clarity in the following description of the method based FIG. 4 the reference signs used above in the description of apparatus based FIGS. 1-3 will be maintained.

Figure 4:
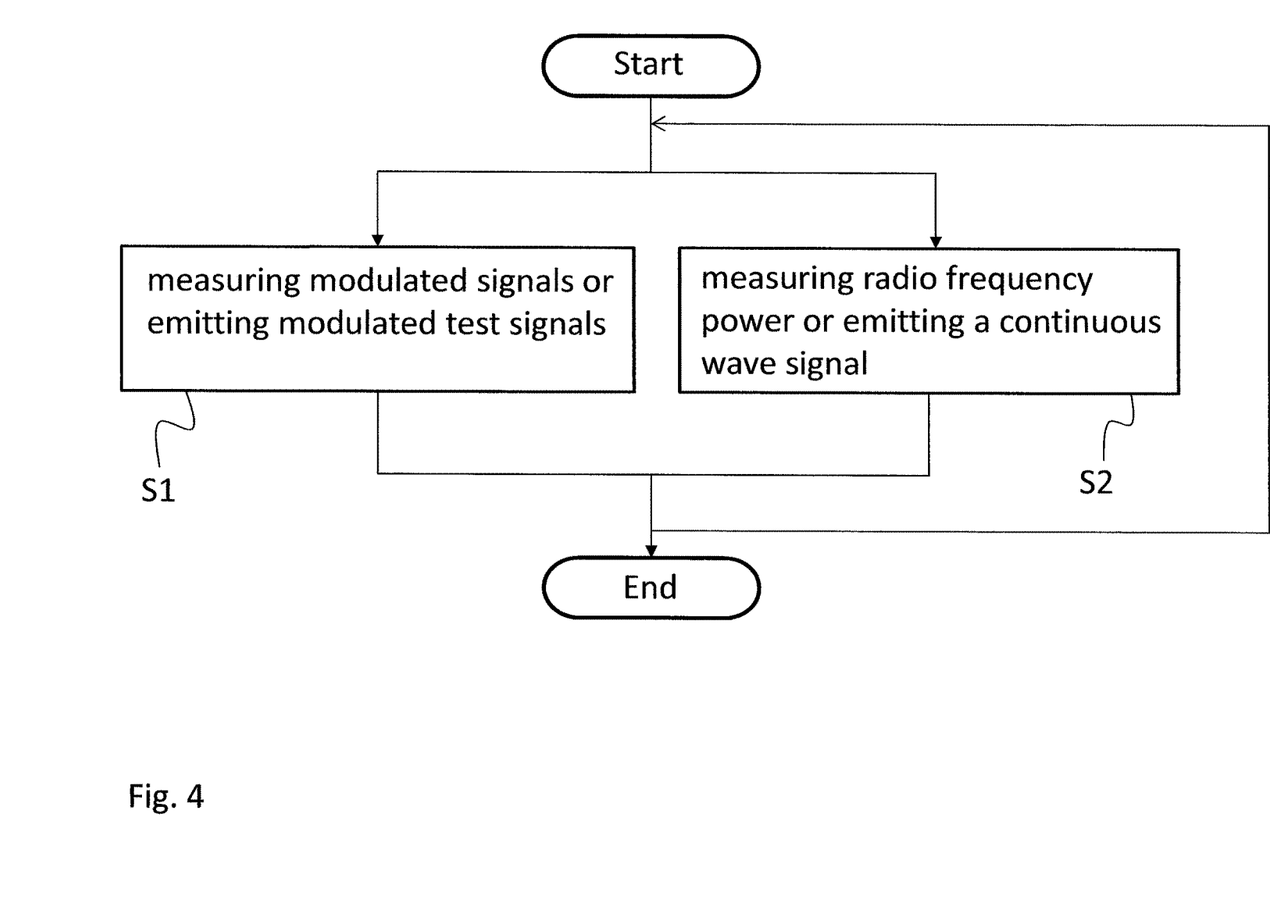
FIG. 4 shows a block diagram of an embodiment of a test method according to the present invention.

FIG. 4 shows a block diagram of a test method for testing a device under test.

The test method comprises a step S1 of measuring modulated signals emitted by the device under test 110, 210, 310 or emitting modulated test signals to the device under test 110, 210, 310. Especially, the measurement of the signals and the emitting of the modulated test may be performed by the signal analysing device 120, 220, 320. Further, the test method comprises a step S2 of measuring radio frequency power emitted by the device under test 110, 210, 310 or emitting a continuous wave signal to the device under test 110, 210, 310. Especially, the measuring of the radio frequency power and the emitting of the continuous wave signal may be performed with a plurality of power analysing devices 130, 230, 330.

The measuring S1 of the modulated signals or emitting modulated test signals and the measuring S2 radio frequency power or emitting a continuous wave signal each may be operated in a number of test sequences without removing or reconnecting the device under test 110, 210, 310.

The measuring S1 of the modulated signals or the emitting of the modulated test signals may be performed by a measurement antenna 121, 221, 321. Especially, the method may comprise analysing the measured modulated signals, for instance, by a signal analyser 122, or generating modulated test signals, for instance, by a signal generator 123.

The measurement antenna 121, 221, 321 may be arranged at a boresight direction of the device under test 110, 210, 310.

The test method may measure the modulated signals or emit modulated test signals and measure radio frequency power or emit a continuous wave signal simultaneously.

The test method may comprise carrying the measurement antenna 121, 221, 321 and/or the power analysing devices 130, 230, 330. Further, the method may comprise moving the measurement antenna 121, 221, 321 and/or the power analysing devices 130, 230, 330 around the device under test 110, 210, 310. These are steps may be performed, for instance, by a mechanical positioning structure 240.

The measurement antenna 121, 221, 321 and/or the power analysing devices 130, 230 330 may be moved around the device under test 110, 210, 310 on a circular circumference or on a spherical circumference.

Alternatively, the plurality of power analysing devices 130, 230, 330 may be arranged at predetermined positions.

The test method may comprise a step of providing communication signals to the device under test 110, 210, 310. The communication signals may be provided by a communication controller 370. The communication controller 370 may be communicatively coupled to the signal analysing device 120, 220, 320.

The test method may further comprise a step of providing the communication signals to the signal analysing device 120, 220, 320.

The test method may further comprise a step of carrying the device under test 110, 210, 310 and controllably rotating and/or translating the device under test. These are steps may be performed, for instance, by a mechanical device positioning structure 240.

The test method may further comprise a step of accommodating the signal analysing device 120, 220, 320, the number of power analysing devices 130, 230, 330 and the device under test 110, 210, 310 in a measurement chamber.

Summarizing, the present invention relates to a test arrangement and a test method for testing a device under test. In particular, a test arrangement is provided comprising a device for vectorial analysis of measurement signals and at least one further device for analysing only the power of radio frequency signals related to the device under test. By simultaneously operating the device for vectorial analysis and the device for analysing the power, an efficient testing can be achieved.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF USED REFERENCE SIGNS 100, 200, 300 test arrangement
110, 210, 310 device under test
120, 220, 320 signal analysing device
121, 221, 321 measurement antenna
122, 222 signal analyser
123, 223 signal generator
130, 230, 330 power measurement device
240, 340 mechanical positioning structure
360 measurement controller
370 communication controller
380 mechanical device positioning structure
S1, S2 method steps

What we claim is:
1. A test arrangement for testing a device under test, the test arrangement comprising:
 a signal analysing device for measuring modulated signals emitted by the device under test or for emitting modulated test signals to the device under test;

a plurality of power analysing devices for measuring radio frequency power emitted by the device under test or for emitting a continuous wave signal to the device under test, wherein the plurality of power analysing devices comprises at least one power analysing device for measuring radio frequency power and at least one power analysing device for emitting a continuous wave signal to the device under test;

wherein the signal analysing device and the power analysing device each are operated in a number of test sequences without removing or reconnecting the device under test; and wherein at least one test is performed with respect to modulated test signals, and at least one other test is performed considering only the power emitted by the device under test or the continuous wave signal emitted to the device under test.

2. The test arrangement of claim 1, wherein the signal analysing device and the power analysing devices are operated simultaneously.

3. The test arrangement of claim 1, wherein the signal analysing device comprises at least one of:
a measurement antenna for measuring the modulated signals emitted by the device under test;
a measurement antenna for emitting the modulated test signals to the device under test;
a signal analyser, electrically coupled to the measurement antenna, for analysing the modulated signals measured by the measurement antenna;
a signal generator for generating modulated test signals to be emitted by the measurement antenna.

4. The test arrangement of claim 3, wherein the measurement antenna is arranged at a boresight direction of the device under test.

5. The test arrangement of claim 1, further comprising a mechanical positioning structure that is configured and arranged to carry the measurement antenna or the power analysing devices and that is further configured to controllably move the measurement antenna or the power analysing devices, respectively, around the device under test.

6. The test arrangement of claim 5, wherein the mechanical positioning structure is configured and arranged to move the measurement antenna or the power analysing devices around the device under test on a circular or spherical circumference.

7. The test arrangement of claim 1, wherein the plurality of power analysing devices are arranged at predetermined positions.

8. The test arrangement of claim 1, further comprising a communication controller that is communicatively coupled to the signal analysing device that is configured to perform communication with the device under test.

9. The test arrangement of claim 8, wherein the communication controller is communicatively coupled to the signal analysing device and configured to provide to the signal analysing device system with signals to be emitted to the device under test.

10. The test arrangement of claim 1, further comprising a mechanical device positioning structure that is configured and arranged to carry the device under test and that is further configured to controllably rotate or translate the device under test.

11. The test arrangement of claim 1, comprising a measurement chamber that is configured and arranged to accommodate the signal analysing device, the plurality of power analysing devices and the device under test.

12. A test method for testing a device under test, the test method comprising:
measuring modulated signals emitted by the device under test or emitting modulated test signals to the device under test with a signal analysing device;
measuring radio frequency power emitted by the device under test by at least one power analysing device; and
emitting a continuous wave signal to the device under test with at least one further power analysing device;
wherein the measuring modulated signals or emitting modulated test signals, the measuring radio frequency power and the emitting a continuous wave signal each are operated in a number of test sequences without removing or reconnecting the device under test; and
wherein at least one test is performed with respect to modulated test signals, and at least one other test is performed considering only the power emitted by the device under test or the continuous wave signal emitted to the device under test.

13. The test method of claim 12, wherein the measuring modulated signals, or emitting modulated test signals, the measuring radio frequency power and the emitting a continuous wave signal are performed simultaneously.

14. The test method of claim 12, wherein the measuring of the modulated signals or the emitting of the modulated test signals is performed by a measurement antenna and wherein the method further comprises at least one of:
analysing the measured modulated signals by a signal analyser,
generating modulated test signals by a signal generator.

15. The test method of claim 14, wherein the measurement antenna is arranged at a boresight direction of the device under test.

16. The test method of claim 12, further comprising:
carrying the measurement antenna or the power analysing devices; and
moving the measurement antenna or the power analysing devices around the device under test by a mechanical positioning structure.

17. The test method of claim 16, wherein the measurement antenna or the power analysing devices, respectively, are moved around the device under test on a circular circumference or on a spherical circumference.

18. The test method of claim 12, wherein the plurality of power analysing devices are arranged at predetermined positions.

19. The test method of claim 12, further comprising:
providing communication signals to the device under test by a communication controller being communicatively coupled to the signal analysing device.

20. The test method of claim 19, further comprising:
providing the communication signals to the signal analysing device.

21. The test method of claim 12, further comprising:
carrying the device under test and controllably rotating or translating the device under test by a mechanical device positioning structure.

22. The test method of claim 12, further comprising:
accommodating the signal analysing device, the plurality of power analysing devices and the device under test in a measurement chamber.

* * * * *